(12) United States Patent
Lucas

(10) Patent No.: US 7,561,008 B2
(45) Date of Patent: Jul. 14, 2009

(54) FILTER PACKAGE

(75) Inventor: Donald J. Lucas, Stoneham, MA (US)

(73) Assignee: Azure Dynamics, Inc., Woburn, MA (US)

( * ) Notice: Subject to any disclaimer, the term of this patent is extended or adjusted under 35 U.S.C. 154(b) by 145 days.

(21) Appl. No.: 11/590,322

(22) Filed: Oct. 31, 2006

(65) Prior Publication Data

US 2008/0100400 A1    May 1, 2008

(51) Int. Cl.
*H03H 7/00* (2006.01)
*H03H 7/03* (2006.01)

(52) U.S. Cl. ...................................... 333/181; 333/185

(58) Field of Classification Search ................. 333/181, 333/185, 12, 167, 172
See application file for complete search history.

(56) References Cited

U.S. PATENT DOCUMENTS 4,761,623 A * 8/1988 Schneider .................... 333/167
6,958,666 B2 * 10/2005 Begon et al. ................. 333/185

* cited by examiner

*Primary Examiner*—Dean O Takaoka
(74) *Attorney, Agent, or Firm*—Iandiorio Teska & Coleman

(57) ABSTRACT

A filter package includes a pair of spaced circuit boards; a magnetic core between the circuit boards; a plurality of windings on the core extending to at least one of the boards; and a plurality of conductor bars mechanically fastening and electrically interconnecting the circuit boards.

20 Claims, 8 Drawing Sheets

FILTER PACKAGE

FIELD OF THE INVENTION

This invention relates to an improved filter package and more particularly to such a filter package for EMI/RFI and inverter frequencies.

BACKGROUND OF THE INVENTION

Conventional EMI/RFI filter and inverter frequency filters typically include a filter stage having a common mode core with two or more windings: e.g. two for d.c., three for a.c., four for "Y" connected a.c. with a neutral. There is also a common mode filter capacitor circuit including one or more capacitors and a differential filter capacitor circuit also including one or more capacitors. The core may be ferrite, iron powder, Mn—Zn or other material depending upon the desired permeability and current requirements. The capacitors are typically disc ceramic. The cores tend to be large and heavy and there may be more than one stage required to meet the filtering demands thereby increasing the number of cores and the size and weight of the filter package. And higher current demands require even larger components. The size and weight are particularly critical in mobile applications such as electric and hybrid vehicles.

BRIEF SUMMARY OF THE INVENTION

It is therefore an object of this invention to provide an improved filter package.

It is a further object of this invention to provide such an improved filter package which is applicable to EMI/RFI filters and inverter frequency filters.

It is a further object of this invention to provide such an improved filter package which is lighter and smaller and compact even with high current capabilities.

It is a further object of this invention to provide such an improved filter package which is easier to fabricate.

The invention results from the realization that a smaller, lighter, compact filter package can be achieved by packaging the core between a pair of circuit boards with the core windings interconnected to/through the circuit board(s) and a plurality of connector bars mechanically fastened and electrically interconnecting together the circuit boards.

The subject invention, however, in other embodiments, need not achieve all these objectives and the claims hereof should not be limited to structures or methods capable of achieving these objectives.

This invention features a filter package including a pair of spaced circuit boards, a magnetic core between the circuit boards, and a plurality of windings on the core extending to at least one of the boards. There are a plurality of conductor bars mechanically fastening and electrically interconnecting the circuit boards.

In a preferred embodiment there may a differential capacitor filter circuit carried by at least one of the circuit boards and electrically interconnected with the windings. There may be a common mode filter capacitor circuit carried by at least one of the circuit boards and electrically interconnected with the windings. There may be at least two differential inductors disposed on the windings with the core between the circuit boards. The circuit boards may each include a ground plane conductor. There may be at least one filter capacitor circuit on at least one of the circuit boards on the outside of the circuit board from the ground plane and core. The circuit boards may be generally rectangular and there may be a conductor bar proximate each corner or they may be generally circular with three spaced conductor bars. There may be at least two windings on the core for d.c. filtering and at least three for a.c. three phase filtering. The core may be a nanocrystalline amorphous core. The windings may electrically connect to at least one board. The windings may extend through at least one board.

This invention also features an EMI/RFI filter package including a pair of spaced circuit boards, a nanocrystalline amorphous magnetic core between the circuit boards and a plurality of windings on the core extending to at least one of the boards. There may be a plurality of conductor bars mechanically fastening and electrically interconnecting the circuit boards.

In a preferred embodiment the circuit boards may each include a ground plane conductor. There may be a common mode capacitor filter circuit and/or a differential capacitor filter circuit disposed on at least one of the boards on the outside of the ground plane conductor and core.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
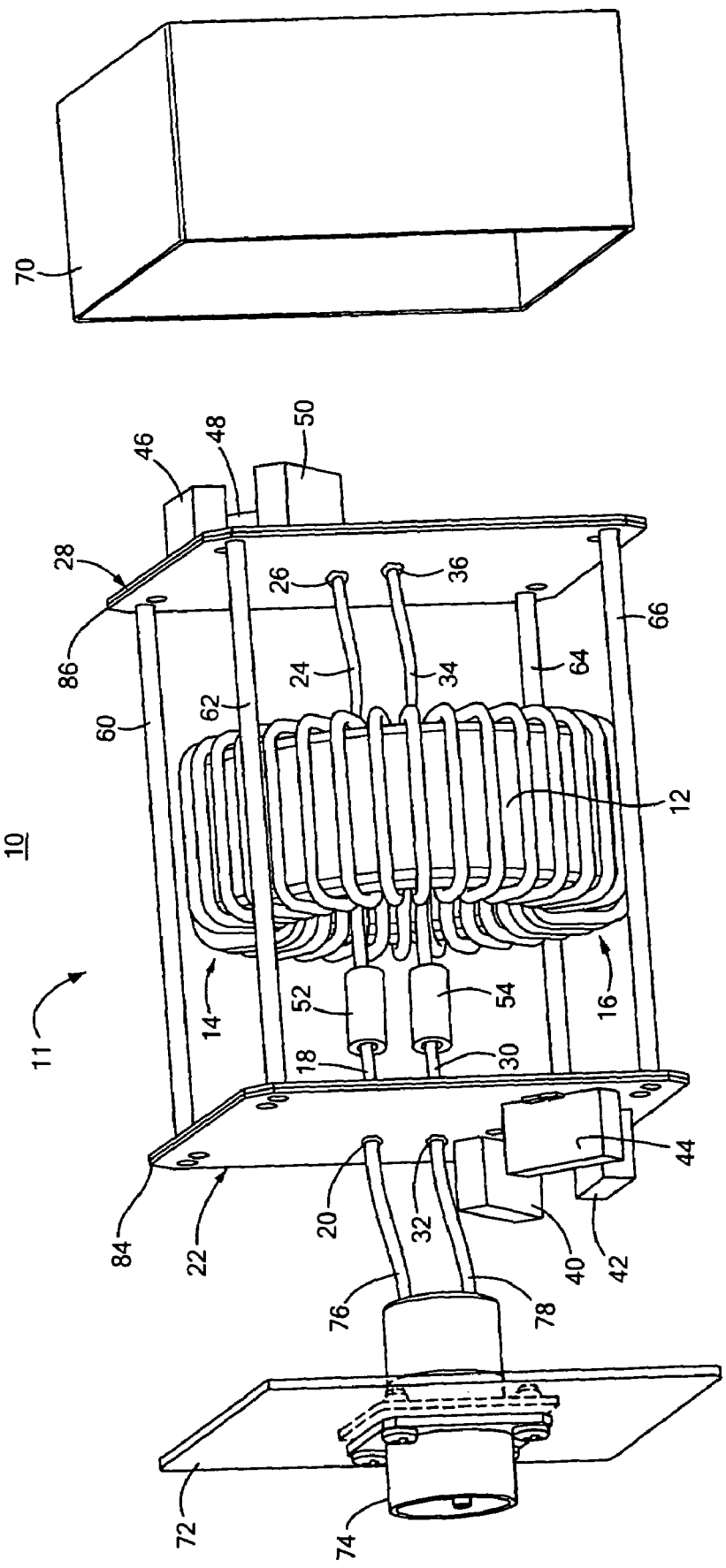
FIG. 1 is an exploded three dimensional diagrammatic view of a filter package according to this invention implementing a d.c. filter.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a d.c. EMI/RFI filter 10 package including inductor 11 having a core 12 which may be a nanocrystalline amorphous material such as Metglas FT-3M available from Metglas, Inc. and may include two d.c. windings 14 and 16. Winding 14 has one lead 18 soldered at 20 to circuit board 22 and its other lead 24 soldered at 26 to circuit board 28. Winding 16 has one lead 30 soldered at 32 to circuit board 22 and lead 34 soldered at 36 to circuit board 28. Either one or both of circuit boards 22 and 28 may include one or more capacitors 40, 42, 44, 46, 48, and 50 which may make up a common mode capacitor circuit or differential filter capacitor circuit. The capacitors, for example, may be lower frequency filter film capacitors of for example 0.022 µf for approximately a 200 to 300 KHz range. Or they may be multi-layer ceramic capacitors for example of 470 pf for filtering in the range of 200 MHz.

Figure 1A:
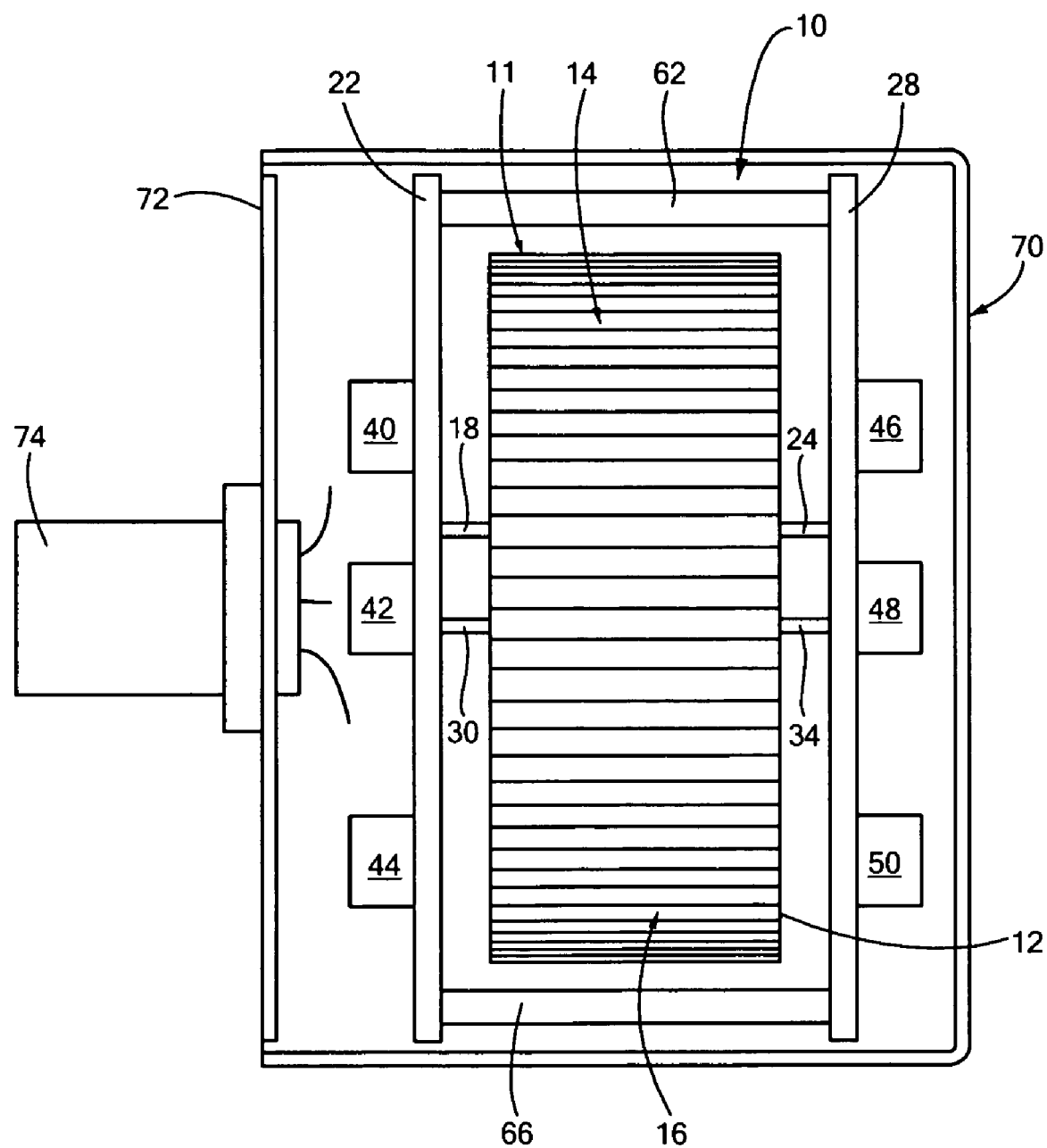
FIG. 1A is a side sectional diagrammatic view of the package of FIG. 1 according to this invention collapsed to a normal unexploded view.

Also included in the package there may be differential inductors 52, 54 which may be for example ferrite beads which are mounted on the leads, for example leads 18 and 30, with core 12 between circuit boards 22 and 28. Circuit boards 22 and 28 are both shown as generally rectangular in shape. The package may be mechanically fixed together by bars 60, 62, 64, 66 which may be copper bars or other conductor bars that are mechanically fastened proximate the corners of circuit boards 22 and 28 for mechanical rigidity and which also electrically interconnect those boards. The entire package 10 may be installed in five sided housing 70 made of metal such as steel for example and drawn to be seamless. Housing 70 may be closed by metal cover 72 being welded, brazed or soldered to it. Metal cover 72 may contain a connector 74 which connects to the various leads and conductors in package 10. Leads 76, 78 from connector 74 may be connected at solder contacts 20, 32 to leads 18, 30, respectively. Each printed circuit board may have a ground plane conductor 84, 86 on it or embedded in it to reduce emissions of electromagnetic interference. Preferably capacitors such as 40, 42, 44, and 46, 48, 50, FIG. 1 are on the outside of the ground plane conductors and inductor 11. When completed package 10, FIG. 1A, constitutes a small, compact, lightweight package which can have a volume as little as a two inch cube at lower currents in the milliamp range and as small as a three inch cube at higher currents in 10 or 100 amp range.

Figure 2:
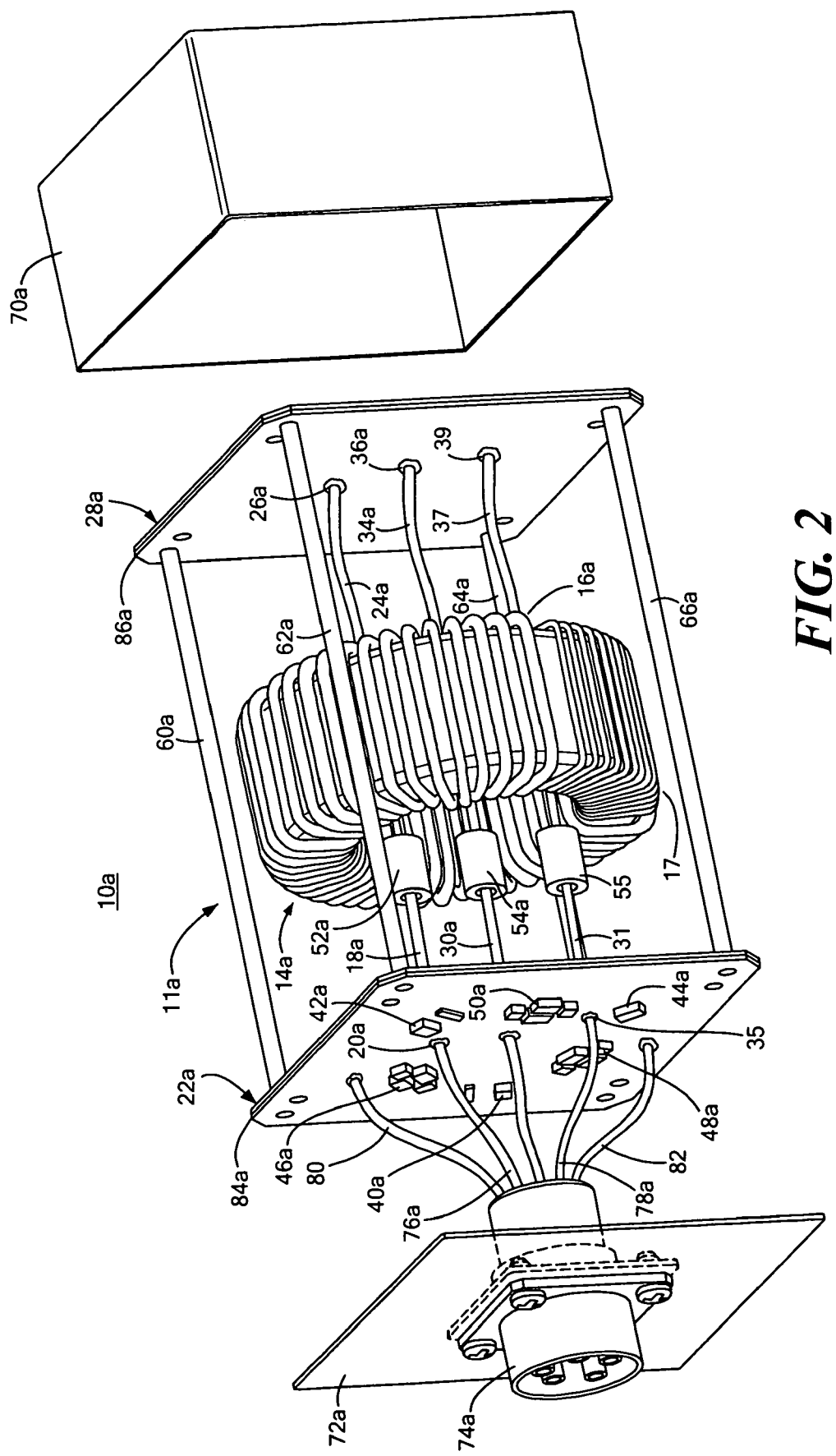
FIG. 2 is an exploded three dimensional diagrammatic view of a filter package according to this invention implementing an a.c. filter.

In accordance with this invention the filter package may be used with single phase a.c filters in which case the construction would be the same as in FIG. 1 or it may be used for multi-phase Δ or Y connected a.c. as shown in FIG. 2. In FIG. 2 and the following figures similar parts have been given like numbers accompanied by a lower case letter. In FIG. 2 a third winding 17 has been added to core 11a, wound around core 12a which again may be nanocrystalline amorphous material. Now, in addition to windings 14a and 16a, there is a third winding 17 which has lead 31 soldered to circuit board 22a at 35 and lead 37 soldered at 39 to circuit board 28a. A third differential inductor 55 is disposed on lead 31. Third winding 17 has lead 31 connected at solder contact 35 to circuit board 22a, where it may be connected to lead 78a from connector 74a. The other lead 37 of winding 17 is connected at solder connect 39 to circuit board 28a. Connector 74a may also provide ground lead 80 and frame lead 82.

Figure 3:
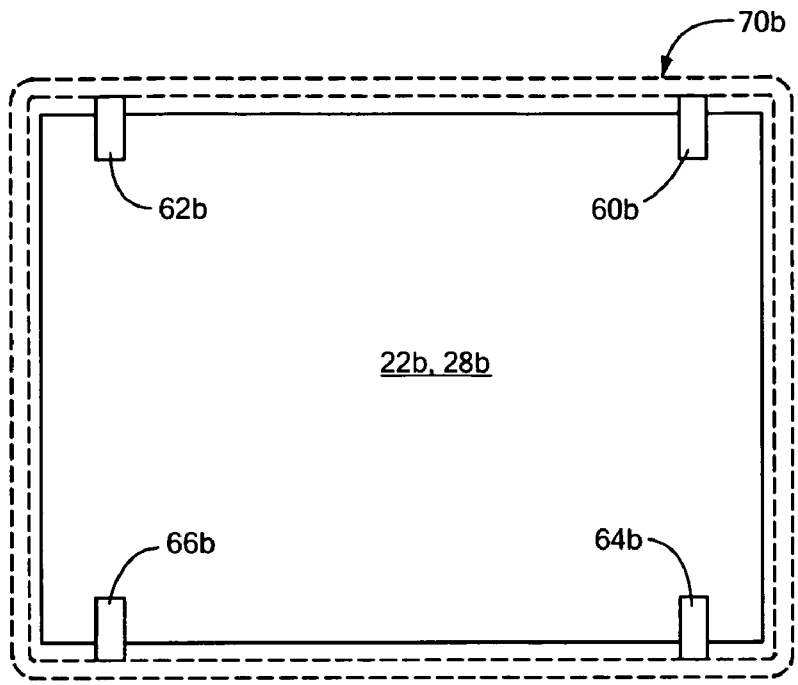
FIG. 3 is a schematic elevational view of a circuit board showing enlarged conductor bars for attachment to the housing.
Figure 4:
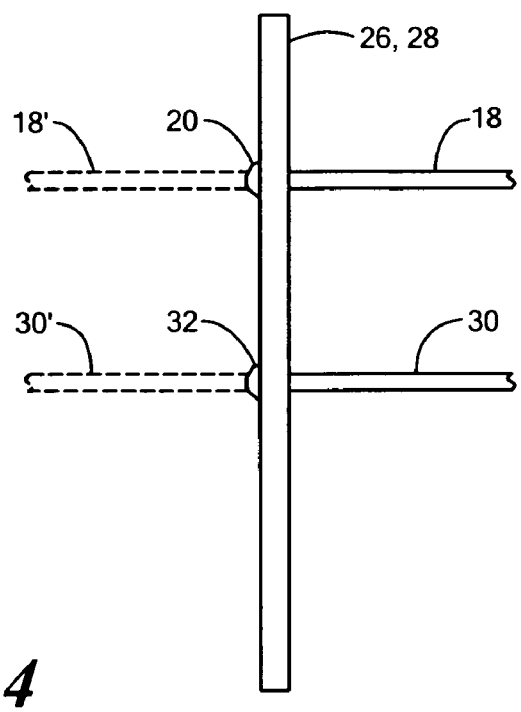
FIG. 4 is a schematic side elevational view of a circuit board showing winding leads to and through the board.
Figure 4A:
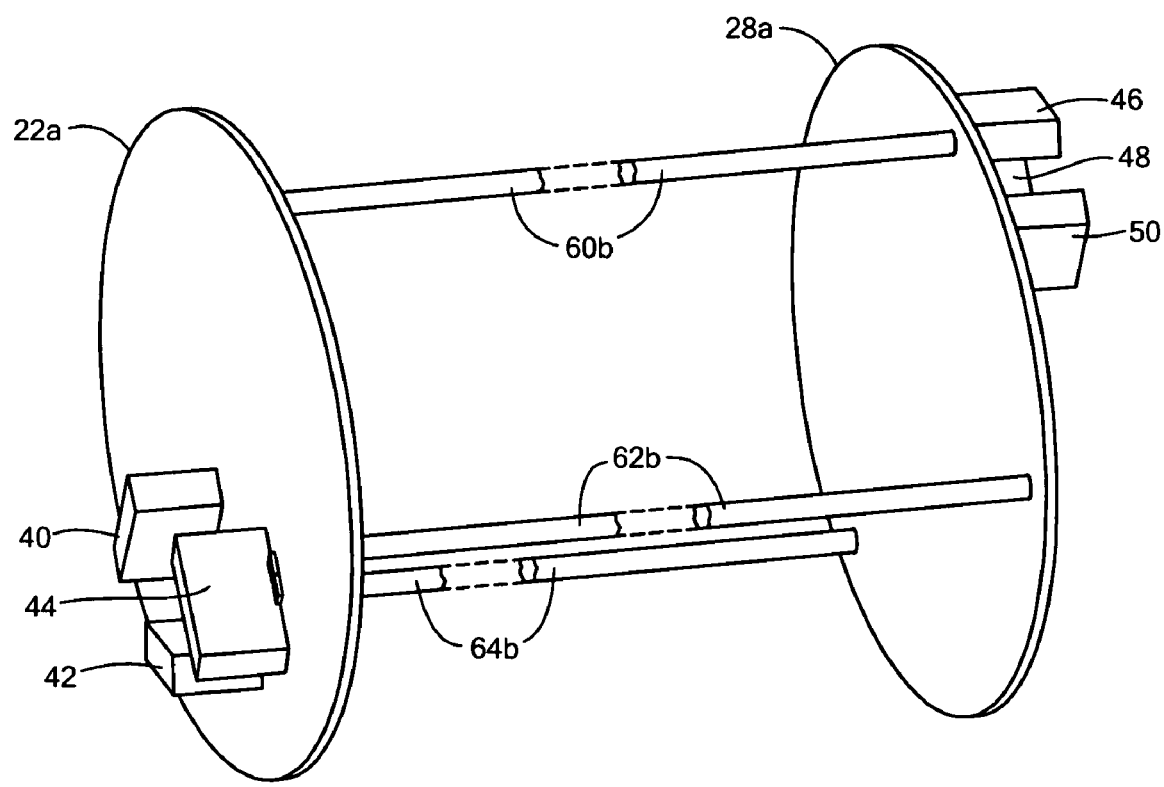
FIG. 4A is a view similar to FIGS. 1 and 2 with parts removed showing round circuit boards.

Although the conductor bars 60, 62, 64, 66 are shown connected to circuit boards 22a and 28a proximate their corners but within their periphery this is not a necessary limitation of the invention. For example, it is often advantageous to have bars 60b, 62b, 64b, 66b, FIG. 3, extend slightly beyond the periphery of boards 22b and 28b so that they can be mechanically fastened to and electrically connected to housing 70b for increased rigidity and electrical security. In some cases, leads 18, 30, 31, 24, 34, and 37 may be connected as exemplified by leads 18 and 30 in FIG. 4. They may extend to circuit board 26 or 28 and end there at solder connections 20 and 32, respectively, or they may continue through the circuit boards as shown at 18' and 30', FIG. 4, and may or may not have a solder connection at 20 and 32. Although circuit boards 22 and 28 are shown, supra, as generally rectangular in shape, this in not a necessary limitation of the invention they could be any suitable shape. For example, they could be round 22a, 28a, FIG. 4A, in which case perhaps only three bars 60b, 62b, 64b spaced at 120° could be used to fix them together and the could be mounted in a pipe-like or deep drawn cylindrical container.

Figure 5:
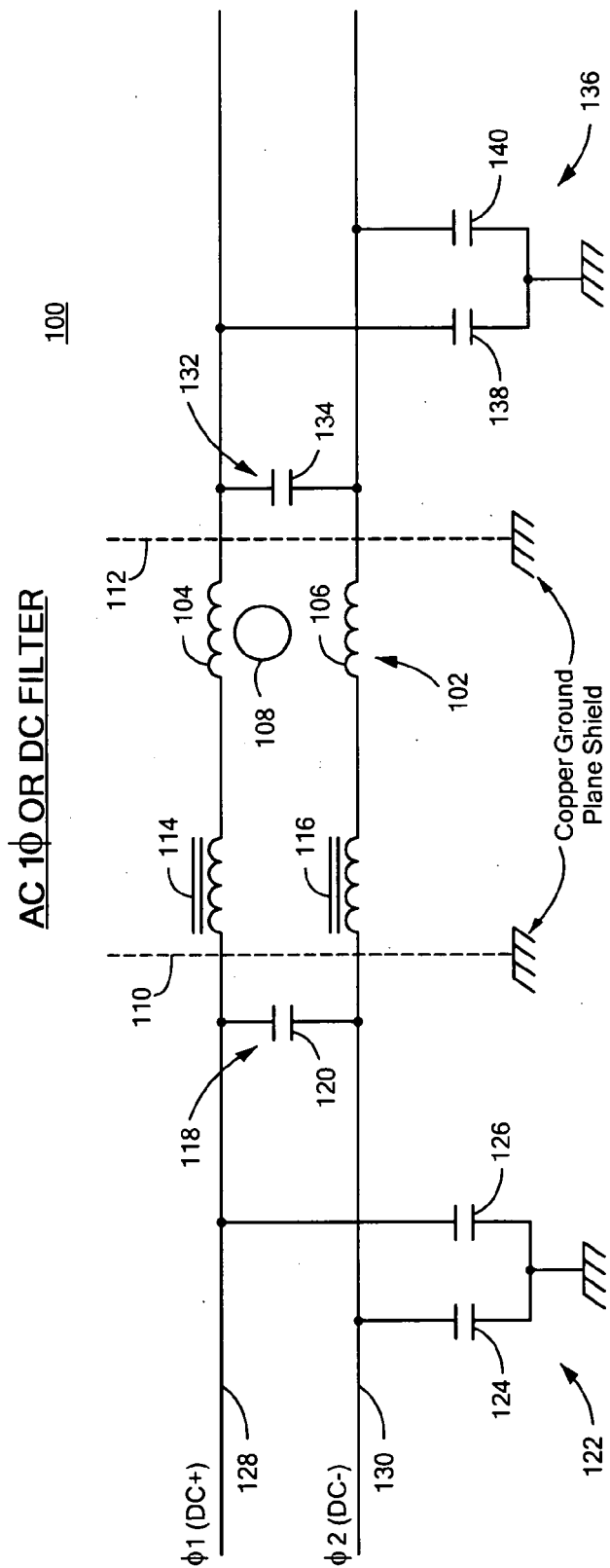
FIGS. 5, 6, and 7 are schematic diagrams of the d.c. a.c. Δ, connected and a.c. Y connected filter networks, respectively, that may be contained in the filter package of this invention.

A typical d.c. EMI/RFI filter or single phase a.c. EMI/RFI filter that may be packaged in accordance with this invention is shown at 100, FIG. 5, as including a common mode inductor 102, including two coils 104, 106 and a core 108 typically made with amorphous nanocrystalline material in accordance with this invention. Inductor 102 including core 108 and windings 104, 106 are inside of ground plane conductors 110 and 112. Also inside of ground plane conductors 110 and 112 are differential inductors 114 and 116. External of ground plane conductors 110 is differential capacitor filter circuit 118 including single capacitor 120 and common mode filter capacitor circuit 122 composed of two capacitors 124 and 126. For this filter the electrical inputs may be d.c.+ and d.c.− on lines 128 and 130 or they may be for a single phase a.c. circuit. A second differential capacitor filter circuit 132 including capacitor 134 and a second common mode capacitor filter circuit 136 including capacitors 138 and 140 may be disposed outside ground plane 112.

Figure 6:
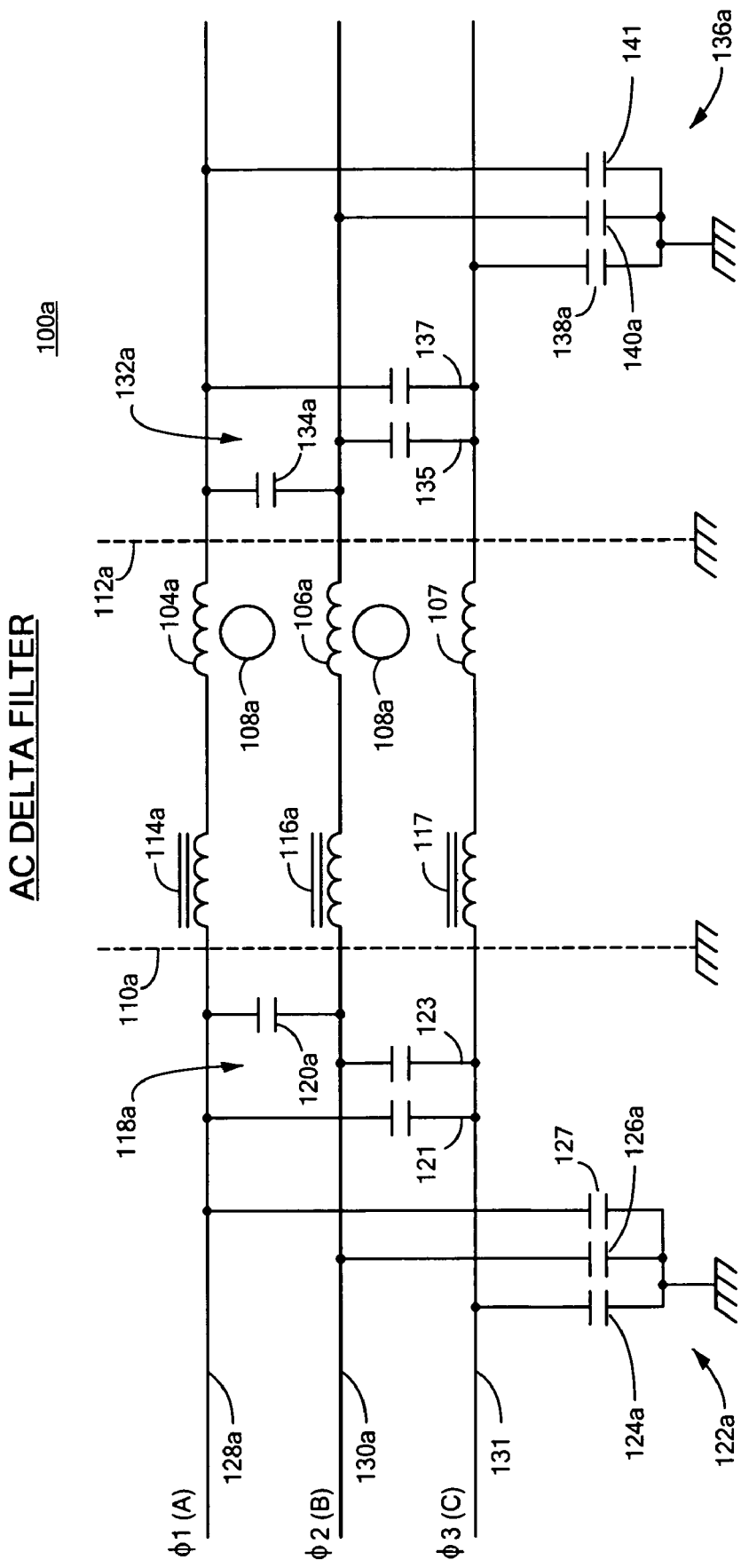

The filter package according to this invention also applies to three wire filter circuits, 100a, FIG. 6, where the inputs are the three a.c. A connected phases 128a, 130a and 131. Inside ground planes 110a and 112a, core 108a now has three windings on it 104a, 106a and 107. And there are three differential inductors 114a, 116a, and 117. External to ground plane 110a differential filter 118a has, in addition to capacitor 128a, two more capacitors 121 and 123. Common mode filter capacitor circuit 122a has a third capacitor 127 in addition to capacitors 124a and 126a. Likewise, external to ground plane conductor 112a, differential capacitor filter circuit 132a includes capacitor 134a and additional capacitors 135 and 137 while common mode capacitor filter circuit 136a includes additional capacitor 141 along with capacitors 138a and 140a.

Figure 7:
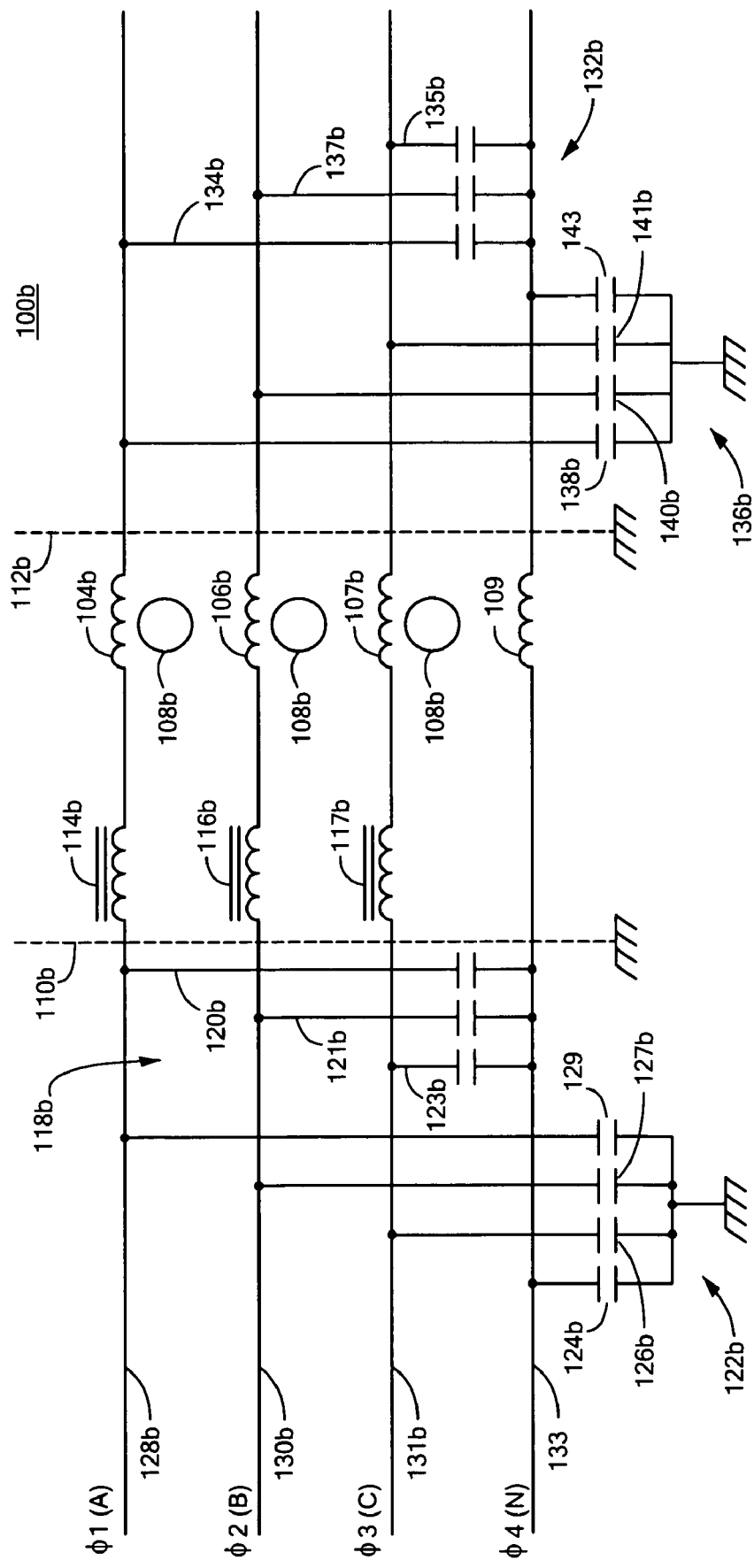

The filter package of this invention may also be used to package four wire systems. For example, four wire a.c. Y connected filter 100b, FIG. 7, includes three phase inputs 128b, 130b, 131b, and neutral 133. There may also be a differential capacitor filter circuit 132b including capacitors 134b, 137b and 135b and a common mode capacitor filter circuit 136b including capacitor 143 in addition to capacitors 138b, 140b, 141b.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A filter package comprising:
   a pair of spaced circuit boards,
   a filter stage magnetic core disposed inbetween said circuit boards;
   a plurality of windings on said core extending to at least one of said boards; and
   a plurality of structural conductor bars mechanically fastened to and electrically interconnecting said circuit boards.

2. The filter package of claim 1 further including a differential capacitor filter circuit carried by at least one of said circuit boards and electrically interconnected with said windings.

3. The filter package of claim 1 further including a common mode filter capacitor circuit carried by at least one of said circuit boards and electrically interconnected with said windings.

4. The filter package of claim 1 further including at least two differential inductors disposed on said windings with said core between said circuit boards.

5. The filter package of claim 1 in which said circuit boards each include a ground plane conductor.

6. The filter package of claim 5 further including at least one filter capacitor circuit on at least one of said circuit boards on the outside of said circuit board from said ground plane and core.

7. The filter package of claim 1 in which said circuit boards are generally rectangular and there is a conductive bar proximate each corner.

8. The filter package of claim 1 in which said circuit boards are generally circular and there are three spaced conductor bars fixing them together.

9. The filter package of claim 1 in which there are at least two windings on said core for d.c. filtering.

10. The filter package of claim 1 in which there are at least three windings on said core for a.c. filtering.

11. The filter package of claim 1 in which said core is a nanocrystalline amorphous core.

12. The filter package of claim 1 in which said windings electrically connect to said at least one board.

13. The filter package of claim 1 in which said windings extend through said at least one board.

14. An EMI/RFI filter package comprising:
    a pair of spaced circuit boards;
    a nanocrystalline amorphous magnetic core between said circuit boards;
    a plurality of windings on said core extending to at least one of said boards;
    a plurality of structural conductor bars mechanically fastened to and electrically interconnecting said circuit boards.

15. The EMI-RFI filter package of claim 14 in which said circuit boards each include a ground plane conductor.

16. The EMI-RFI filter package of claim 15 further including a common mode capacitor filter circuit and a differential capacitor filter circuit disposed on at least one of said boards on the outside of said ground plane conductor and core.

17. A filter package comprising:
    a pair of spaced generally rectangular circuit boards;
    a magnetic core between said circuit boards;
    a plurality of windings on said core extending to at least one said board; and
    at least four conductor bars each mechanically fastened proximate a corner of the circuit boards and electrically interconnecting said circuit boards.

18. A filter package comprising:
    a pair of spaced generally circular circuit boards;
    a magnetic core between said circuit boards;
    a plurality of windings on said core extending to at least one of said boards; and
    three spaced conductor bars mechanically fastened to and electronically interconnecting said circuit boards.

19. A filter package comprising:
    a pair of spaced circuit boards;
    a magnetic core between said circuit boards;
    at least two windings on said core for d.c. filtering; and
    a plurality of conductor bars mechanically fastened to and electrically interconnecting said circuit boards.

20. A filter package comprising:
    a pair of spaced circuit boards;
    a magnetic core between said circuit boards;
    a plurality of windings on said core extending to and through at least one said board; and
    a plurality of structural conductor bars mechanically fastened to and electrically connecting said circuit boards.

* * * * *